(12) United States Patent
Wang et al.

(10) Patent No.: US 9,099,638 B2
(45) Date of Patent: Aug. 4, 2015

(54) VERTICAL HALL EFFECT ELEMENT WITH STRUCTURES TO IMPROVE SENSITIVITY

(71) Applicants: Yigong Wang, Rutland, MA (US); Richard B. Cooper, Shrewsbury, MA (US)

(72) Inventors: Yigong Wang, Rutland, MA (US); Richard B. Cooper, Shrewsbury, MA (US)

(73) Assignee: Allegro Microsystems, LLC, Worcester, MA (US)

( * ) Notice: Subject to any disclaimer, the term of this patent is extended or adjusted under 35 U.S.C. 154(b) by 0 days.

(21) Appl. No.: 13/836,869

(22) Filed: Mar. 15, 2013

(65) Prior Publication Data

US 2014/0264667 A1 Sep. 18, 2014

(51) Int. Cl.
*H01L 43/06* (2006.01)
*H01L 27/22* (2006.01)
*H01L 29/82* (2006.01)
*H01L 43/14* (2006.01)
*G01R 33/07* (2006.01)

(52) U.S. Cl.
CPC ............ *H01L 43/065* (2013.01); *G01R 33/077* (2013.01); *H01L 43/14* (2013.01)

(58) Field of Classification Search
USPC .......................................... 257/421, E43.003
IPC ...................................................... H01L 43/065
See application file for complete search history.

(56) References Cited

U.S. PATENT DOCUMENTS

| 4,634,961 A | 1/1987 | Popovic et al. |
| 4,668,914 A | 5/1987 | Kersten et al. |
| 4,761,569 A | 8/1988 | Higgs |
| 4,829,352 A | 5/1989 | Popovic et al. |
| 5,541,506 A | 7/1996 | Kawakita et al. |
| 5,572,058 A | 11/1996 | Biard |
| 5,612,618 A | 3/1997 | Arakawa |
| 5,619,137 A | 4/1997 | Vig et al. |
| 5,621,319 A | 4/1997 | Bilotti et al. |
| 5,657,189 A | 8/1997 | Sandhu |
| 5,694,038 A | 12/1997 | Moody et al. |
| 5,831,513 A | 11/1998 | Lue |
| 5,844,411 A | 12/1998 | Vogt |
| 5,942,895 A | 8/1999 | Popovic et al. |
| 6,064,199 A | 5/2000 | Walter et al. |
| 6,064,202 A | 5/2000 | Steiner et al. |

(Continued)

FOREIGN PATENT DOCUMENTS

DE 10 2005 014 509 B4 10/2006
DE 10 2006 017 910 A1 10/2007

(Continued)

OTHER PUBLICATIONS

Allegro Microsystems, Inc.; "A1140/41/42/43 Data Sheet: Sensistive Two-Wire Chopper-Stabilized Unipolar Hall-Effect Switches;" published Sep. 9, 2004; pp. 1-11.

(Continued)

*Primary Examiner* — Marcos D Pizarro
(74) *Attorney, Agent, or Firm* — Daly, Crowley, Mofford & Durkee, LLP

(57) ABSTRACT

A vertical Hall Effect element includes one or more of: a low voltage P-well region disposed at a position between pickups of the vertical Hall Effect element, Light-N regions disposed under the pickups, a pre-epi implant region, or two epi regions to result in an improved sensitivity of the vertical Hall Effect element. A method results in the vertical Hall Effect element having the improved sensitivity.

10 Claims, 9 Drawing Sheets

(56) References Cited

U.S. PATENT DOCUMENTS

| | | | |
|---|---|---|---|
| 6,091,239 A | 7/2000 | Vig et al. | |
| 6,100,680 A | 8/2000 | Vig et al. | |
| 6,166,535 A | 12/2000 | Irle et al. | |
| 6,232,768 B1 | 5/2001 | Moody et al. | |
| 6,236,199 B1 | 5/2001 | Irle et al. | |
| 6,265,864 B1 | 7/2001 | De Winter et al. | |
| 6,288,533 B1 | 9/2001 | Haeberli et al. | |
| 6,297,627 B1 | 10/2001 | Towne et al. | |
| 6,356,741 B1 | 3/2002 | Bilotti et al. | |
| 6,525,531 B2 | 2/2003 | Forrest et al. | |
| 6,542,068 B1 | 4/2003 | Drapp et al. | |
| 6,545,462 B2 | 4/2003 | Schott et al. | |
| 6,622,012 B2 | 9/2003 | Bilotti et al. | |
| 6,768,301 B1 | 7/2004 | Hohe et al. | |
| 6,969,988 B2 | 11/2005 | Kakuta et al. | |
| 7,030,606 B2 | 4/2006 | Kato et al. | |
| 7,038,448 B2 | 5/2006 | Schott et al. | |
| 7,085,119 B2 | 8/2006 | Bilotti et al. | |
| 7,119,538 B2 | 10/2006 | Blossfeld | |
| 7,159,556 B2 | 1/2007 | Yoshihara | |
| 7,235,968 B2 | 6/2007 | Popovic et al. | |
| 7,259,556 B2 | 8/2007 | Popovic et al. | |
| 7,307,824 B2 | 12/2007 | Bilotti et al. | |
| 7,362,094 B2 | 4/2008 | Voisine et al. | |
| 7,714,570 B2 | 5/2010 | Thomas et al. | |
| 7,746,065 B2 | 6/2010 | Pastre et al. | |
| 7,759,929 B2 | 7/2010 | Forsyth | |
| 7,872,322 B2 | 1/2011 | Schott et al. | |
| 7,911,203 B2 | 3/2011 | Thomas et al. | |
| 7,965,076 B2 | 6/2011 | Schott | |
| 7,994,774 B2 | 8/2011 | Thomas et al. | |
| 2004/0207031 A1 | 10/2004 | Berndt et al. | |
| 2005/0230770 A1* | 10/2005 | Oohira | 257/421 |
| 2006/0011999 A1 | 1/2006 | Schott et al. | |
| 2007/0029998 A1 | 2/2007 | Popovic et al. | |
| 2007/0267709 A1 | 11/2007 | Oohira | |
| 2007/0290682 A1 | 12/2007 | Oohira et al. | |
| 2009/0121707 A1 | 5/2009 | Schott | |
| 2009/0174395 A1 | 7/2009 | Thomas et al. | |
| 2009/0295375 A1 | 12/2009 | Oohira | |
| 2010/0156397 A1 | 6/2010 | Yabusaki et al. | |
| 2010/0164491 A1 | 7/2010 | Kejik et al. | |
| 2010/0207222 A1* | 8/2010 | Wang | 257/425 |
| 2010/0219810 A1 | 9/2010 | Rocznik et al. | |
| 2010/0252900 A1 | 10/2010 | Minixhofer et al. | |
| 2011/0204460 A1 | 8/2011 | Wong et al. | |
| 2011/0248708 A1 | 10/2011 | Thomas et al. | |
| 2012/0001279 A1* | 1/2012 | Hioka et al. | 257/421 |
| 2012/0313635 A1 | 12/2012 | Daubert | |
| 2013/0021026 A1 | 1/2013 | Ausserlechner | |
| 2013/0021027 A1 | 1/2013 | Ausserlechner | |
| 2013/0057257 A1 | 3/2013 | Friedrich et al. | |

FOREIGN PATENT DOCUMENTS

| | | |
|---|---|---|
| DE | 10 2006 037 226 A1 | 2/2008 |
| EP | 0 631 416 B1 | 12/1994 |
| EP | 0 671 773 A2 | 9/1995 |
| EP | 0 875 733 B1 | 11/1998 |
| EP | 0 916 074 B1 | 5/1999 |
| EP | 2 000 814 A2 | 12/2008 |
| EP | 2 234 185 A1 | 9/2010 |
| EP | 2 503 612 A2 | 9/2012 |
| JP | 58-055688 A | 4/1983 |
| JP | 2003-042709 | 2/2003 |
| JP | 2005-241269 | 9/2005 |
| JP | 2007 027515 A | 2/2007 |
| JP | 2007-147460 | 6/2007 |
| JP | 2010-014607 | 1/2010 |
| JP | 2010-078366 | 4/2010 |
| WO | WO 98/10302 | 3/1998 |
| WO | WO 98/54547 | 12/1998 |
| WO | WO 00/02266 | 1/2000 |
| WO | WO 03/036732 A2 | 5/2003 |
| WO | WO 2004/025742 A1 | 3/2004 |
| WO | WO 2006/056289 A1 | 6/2006 |
| WO | WO 2006/074989 A2 | 7/2006 |
| WO | WO 2008 145662 A1 | 12/2008 |
| WO | WO 2009/124969 A1 | 10/2009 |
| WO | WO 2014/120290 | 8/2014 |
| WO | WO 2014/143404 | 9/2014 |

OTHER PUBLICATIONS

Allegro Microsystems, Inc.; "A1174 Data Sheet: Ultrasensitive Hall Effect Latch with Internally or Externally Controlled Sample and Sleep Periods for Track Ball and Scroll Wheel Applications;" published Jul. 25, 2008; pp. 1-13.

Allegro Microsystems, Inc.; "A1230 Data Sheet: Ultra-Sensitive Dual-Channel Quadrature Hall-Effect Bipolar Switch;" published Mar. 26, 2010; 16 sheets.

Allegro Microsystems, Inc.; "A1351 Data Sheet: High Precision Linear Hall Effect Sensor with a Push/Pull, Pulse Width Modulated Output;" published Mar. 7, 2008; pp. 1-23.

Allegro Microsystems, Inc.; "A1360, A1361 and A1362 Data Sheet: Low-Noise Programmable Linear Hall Effect Sensors with Adjustable Bandwidth (50 $kHz$ Maximum) and Analog Output;" published Mar. 18, 2008; pp. 1-25.

Allegro Microsystems, Inc.; "A3212 Data Sheet: Micropower, Ultra-Sensitive Hall-Effect Switch;" published Sep. 22, 2004; pp. 1-12.

Allegro Microsystems, Inc.; "ATS675LSE Data Sheet: Self-Calibrating TPOS Speed Sensor Optimized for Automotive Cam Sensing Applications;" published Jul. 11, 2008; pp. 1-13.

Allegro Microsystems, Inc.; "27701-AN Data Sheet: Hall-Effect IC Applications Guide;" Application Information, Rev. 2; http://www.allegromicro.com/en/products/design/hall-effect-sensor-ic-applications-guide/AN27701.pdf; downloaded Sep. 29, 2010; pp. 1-40.

Allegro Microsystems, Inc.; "3235 Data Sheet 27633A, Dual-Output Hall-Effect Switch;" http://www.datasheetcatalog.org/datasheets/90/205047_DS.pdf; downloaded Sep. 29, 2010; 6 sheets.

Allegro Microsystems, Inc.; "A3425 Data Sheet: Dual, Chopper-Stabilized, Ultra-Sensitive Bipolar Hall-Effect Switch;" published Jun. 28, 2002; pp. 1-10.

Atherton et al.; "Sensor Signal Conditioning—an IC Designer's Perspective;" IEEE Electro International; Apr 26-28, 1991; pp. 129-134.

Austria Microsystems; "AS5040 datasheet; 10-Bit Programmable Magnetic Rotary Encoder;" Revision 1.1; Jan. 2004; pp. 1-20.

Banjevic et al; "2D CMOS Integrated Magnetometer Based on the Miniaturized Circular Vertical Hall Device;" International Solid-State Sensors, Actuators and Microsystems Conference; Transducers; Jun. 21-25, 2009; pp. 877-880.

Blanchard et al.; "Cylindrical Hall Device;" International Electron Devices Meeting; Dec. 8-11, 1996; pp. 541-544.

Burger et al; "New fully integrated 3-D silicon Hall sensor for precise angular-position measurements;" Sensors and Actuators, A 67; May 1998; pp. 72-76.

Dwyer; Allegro Microsystems, Inc.; "AN296061 Data Sheet: Ring Magnet Speed Sensing for Electronic Power Steering;" published Jul. 21, 2009; pp. 1-4.

Freitas et al; "Giant magnetoresistive sensors for rotational speed control;" Jorunal of Applied Physics, vol. 85, No. 8; Apr. 15, 1999; pp. 5459-5461.

Gilbert; "Technical Advances in Hall-Effect Sensing;" Allegro Microsystems, Inc. Product Description; May 10, 2008; 7 sheets.

Häberlie et al; "Contactless Angle Measurements by CMOS Magnetic Sensor with On Chip Read-Out Circuit;" The $8^{th}$ International Conference on Solid-State Sensors and Actuators and Eurosensors IX; Jan. 25-29, 1995; pp. 134-137.

Häberli et al; "Two-Dimensional Magnetic Microsensor with On-Chip Signal Processing for Contactless Angle Measurement;" IEEE Journal of Solid-State Circuits, vol. 31, No. 12; Dec. 1996; pp. 1902-1907.

Hiligsmann et al.; "Monolithic 360 Degrees Rotary Position Sensor IC;" 2004 IEEE Proceedings of Sensors, vol. 3; Oct. 24-27, 2004; pp. 1137-1142.

(56) References Cited

OTHER PUBLICATIONS

Kejik et al.; "Circular Hall Transducer for Angular Position Sensing;" International Solid-State Sensors, Actuators and Microsystems Conference; Transducers; Jun. 2007; pp. 2593-2596.
Lou Law; "Angle Position Sensing with 2-Axis Hall ICs;" Sensors Magazine, vol. 20, No. 3; Mar. 2003; 7 sheets.
Masson et al; "Multiturn and high precision through-shaft magnetic sensors;" Sensor + Text Conference; Proceedings II; May 2009; pp. 41-46.
Metz at al; "Contactless Angle Measurement Using Four Hall Devices on Single Chip;"; International Conference on Solid State Sensors and Actuators; Transducers; vol. 1; Jun. 16-19, 1997; pp. 385-388.
Munter; "A Low-offset Spinning-current Hall Plate;" Sensors and Actuators, vol. A21-A23; Dec. 2001; pp. 743-746.
novotechnik Siedle Group; "How New Angular Positioning Sensor Technology Opens a Broad Range of New Applications;" Vert-X Technology; Dec. 2001; pp. 1-5.
Paranjape et al.; "A CMOS-compatible 2-D vertical Hall magnetic-field sensor using active carrier confinement and post-process micromachining;" The 8$^{th}$ International Conference on Solid-State Sensors and Acutators, Physical vol. 53, Issues 1-3; May 1996; pp. 278-283.
Petoussis et al.; "A Novel Hall Effect Sensor Using Elaborate Offset Cancellation Method;" Sensors & Transducers Journal, vol. 100, Issue 1; Jan. 2009; pp. 85-91.
Popovic; "Not-plate-like Hall magnetic sensors and their applications;" Sensors and Actuators A; Physical, vol. 85, Issues 1-3; Aug. 2000; pp. 9-17.
Roumenin et al.; "Vertical Hall Effect Devices in the Basis of Smart Silicon Sensors;" IEEE Workshop on Intelligent Data Acquistion and Advanced Computing Systems: Technology and Applications; Sep. 5-7, 2005; pp. 55-58.
Roumenin; "Magnetic sensors continue to advance towards perfection;" Sensors and Actuators A: Physical, vol. 46-47, Issues 1-3; Jan.-Feb. 1995; pp. 273-279.
Schneider et al.; "Temperature Calibration of CMOS Magnetic Vector Probe for Contactless Angle Measurement System;" International Electron Devices Meeting; Dec. 8-11, 1996; pp. 533-536.
SENSIMA technology sa; "CVHD: a new concept of Angular Position Sensor;" Slide Presentation for Allegro Microsystems; Mar. 2009; 17 sheets.
Sentron; AN-101; "Angular position sensing with 2-Axis Hall IC 2SA-10;" Feb. 12, 2004; http://www.diegm.uniud.it/petrella/Azionamenti%20Elettricl%2011/Sensori%20e%20trasduttori/Data%Sheet%20-%202SA-10.pdf; pp. 1-7.
van deer Meer; et al; "CMOS quad spinning-current Hall-sensor system for compass application;" IEEE Proceedings of Sensors, vol. 3; Oct. 24-27, 2004; pp. 1434-1437.
Vogelgesang et al.; Robert Bosch GmbH; "GMR sensors in automotive application;" CS-SNS/ECS Slides Presentation; Mar. 2, 2005; 16 sheets.
Volder; "The CORDIC Trigonometric Computing Technique;" The Institute of Radio Engineers, Inc.; IRE Transactions on Electronic Computers, vol. EC, Issue 3; Sep. 1959; pp. 226-230.
Banjevic; "High Bandwidth CMOS Magnetic Sensors Based on the Miniaturized Circular Vertical Hall Device;" Sep. 2011; 153 pages.
Drijaca, et al.; "Nonlinear Effects In Magnetic Angular Position Sensor With Integrated Flux Concentrator;" Proc. 23$^{rd}$ International Conference on Microelectronics (MIEL 2002); vol. 1; NIS; Yugoslavia; May 12-15, 2002; pp. 223-226.
Melexis MLX 90324; "Under-the-Hood Triaxis Rotary Position feat. SENT Protocol;" 3901090324 Data Sheet; Dec. 2008; 40 pages.
PCT Search Report and Written Opinion of the ISA dated Apr. 15, 2014; for PCT Pat. App. No. PCT/US2014/011773; 8 pages.
Kaufmann et al.; "Novel Coupling Concept for Five-Contact Vertical Hall Devices;" 16th International Solid-State Sensors, Actuators and Microsystems (Transducers) Conference; Jun. 5-9, 2011; 4 sheets.
Response filed Sep. 19, 2014; To Office Action Dated Jun. 19, 2014; For U.S. Appl. No. 13/752,681; 12 Pages.

Office Action dated Jan. 30, 2014; for U.S. Appl. No. 13/752,681; 22 pages.
PCT Search Report and Written Opinion of the ISA dated Jan. 21, 2014; for PCT Pat. App. No. PCT/US2013/064237; 21 pages.
Petrie; "Circular Vertical Hall Magnetic Field Sensing Element and Method with a Plurality of Continuous Output Signals;" U.S. Appl. No. 13/035,243, filed Feb. 25, 2011; 56 pages.
Allegro Microsystems, Inc.; "High Precision Linear Hall Effect Sensor IC with a Push/Pull, Pulse Width Modulated Output;" A1351; pp. 1-23.
Allegro Microsystems, Inc.; "High Precision 2-Wire Linear Hall Effect Sensor IC with a Pulse Width Modulated Output;" A1354; pp. 1-22.
Allegro Microsystems, Inc.; "High Precision Linear Hall-Effect Sensor with an Open Drain Pulse Width Modulated Output;" A1356; pp. 1-20.
Allegro Microsystems, Inc.; "Low-Noise Programmable Linear Hall Effect Sensor ICs with Adjustable Bandwidth (50 kHz Maximum) and Analog Output;" A1360, A1361 and A1362; pp. 1-25.
Baschirotto et al.; "Development and Analysis of a PCB Vector 2-D Magnetic Field Sensor System for Electronic Compasses;" IEEE Sensors Journal, vol. 6, No. 2; Apr. 2006; pp. 365-371.
Kejik, et al.; "Purley CMOS Angular Position Sensor Based on a New Hall Microchip;" 34$^{th}$ Annual Conference of IEEE Industrial Electronics; IECON; Nov. 10-13, 2008; pp. 1777-1781.
Kejik, et al.; "Ultra Low-Power Angular Position Sensor for High-Speed Portable Applications;" 2009 IEEE Sensors Conference; Oct. 25-28, 2009; pp. 173-176.
Reymond, et al.; "True 2D CMOS Integrated Hall Sensor;" 2007 IEEE Sensors Conference; Oct. 28-31, 2007; pp. 860-863.
Gerhauser; "Intelligente 3D-Magnetfeld Snesorik;" Fraunhofer-Institut for Integrierte Schaltungen IIS; www.iis.fraunofer.de/asic/analog; Oct. 2009; 2 pages.
Melexis Microelectronics Integrated Systems; MLX90333; "Triaxis 3D-Joystick Position Sensor;" Data Sheet; Mar. 2009; 43 pages.
MEMSIC Corporation; AN-00MM-004; "Electronic Tilt Compensation;" Mar. 2008; 5 pages.
MEMSIC Corporation; AN-00MM-003; "Magnetic Sensor Calibration;" Mar. 2008; 5 pages.
MEMSIC Corporation; AN-00MM-002; "Magnetometer Soldering Methodology;" Jun. 2008; 2 pages.
MEMSIC Corporation; AN-00MM-001; "Magnetometer Fundamentals;" Jun. 2008; 6 pages.
MEMSIC Corporation; AN-00MM-005; "Magnetic Sensor Placement Guidelines;" Oct. 2008; 2 pages.
MEMSIC Corporation; MMC312xMQ; "Tri-axis Magnetic Sensor, with I$^2$C Interface;" Aug. 14, 2008; 9 pages.
MEMSIC Corporation; MMC314xMS; "Ultra Small 3-axis Magnetic Sensor, with I$^2$C Interface;" Mar. 31, 2010; 8 pages.
Micronas GmbH; "HAL® 3625 Programmable Direct Angle Sensor;" Product Information; Sep. 2009; 2 pages.
Taiwan Office Action and Search Report dated Apr. 21, 2015; for Taiwan Pat App. No. 102137325; 10 pages.
Response to Office Action dated Jan. 30, 2014 corresponding to U.S. Appl. No. 13/752,681; Response made on Apr. 29, 2014; 23 Pages.
Office Action dated Dec. 4, 2014 corresponding to U.S. Appl. No. 13/752,681; 40 Pages.
Office Action dated Dec. 18, 2014 corresponding to U.S. Appl. No. 14/041,063; 30 Pages.
PCT Notification of Transmittal of ISR and Written Opinion dated Dec. 16, 2014 corresponding to Patent Appl. No. PCT/US2014/053826; 1 Page.
PCT International Search Report dated Dec. 16, 2014 corresponding to Patent Appl. No. PCT/US2014/053826; 5 Pages.
PCT Written Opinion dated Dec. 16, 2014 corresponding to Patent Appl. No. PCT/US2014/053826; 8 Pages.

* cited by examiner

VERTICAL HALL EFFECT ELEMENT WITH STRUCTURES TO IMPROVE SENSITIVITY

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to magnetic field sensing elements and, more particularly, to a vertical Hall Effect element having an improved sensitivity to magnetic fields.

BACKGROUND OF THE INVENTION

Hall Effect elements that can sense a magnetic field are known. There is a variety of different types of Hall Effect elements, for example, a planar Hall element, a vertical Hall Effect element, and a circular vertical Hall (CVH) element.

As is known, some of the above-described Hall Effect elements tend to have an axis of maximum sensitivity parallel to a substrate that supports the magnetic field sensing element, and others of the above-described Hall Effect elements tend to have an axis of maximum sensitivity perpendicular to a substrate that supports the magnetic field sensing element. In particular, planar Hall elements tend to have axes of sensitivity perpendicular to a substrate, while vertical Hall Effect elements and CVH sensing elements tend to have axes of sensitivity parallel to a substrate.

Sensitivity is one parameter that can be used to characterize each one of the above types of Hall Effect elements. Sensitivity can be expressed, for example, in units of micro volts per Gauss per volt, i.e., μV/G/V, for which the micro volts per Gauss refers to an output voltage of the Hall Effect element per Gauss experienced by the Hall Effect element, and for which the volts refers to a DC voltage applied to drive the Hall Effect element.

In general, a high sensitivity is desirable, since the high sensitivity provides a good signal-to-noise ratio for an output signal generated by the Hall Effect element.

SUMMARY

The present invention provides a vertical Hall Effect element with a high sensitivity.

In accordance with one aspect, a Hall Effect element disposed over a substrate includes an N-type epitaxial layer disposed over the substrate. The Hall Effect element also includes a plurality of pickups implanted and diffused into the epitaxial layer, adjacent pairs of the plurality of pickups separated by separation regions, each one of the plurality of pickups comprising a respective N-plus type diffusion. The Hall Effect element also includes a plurality of Light-N regions implanted and diffused into the epitaxial layer, each one of the plurality of Light-N regions disposed under a respective one of the plurality of pickups. The Hall Effect element is configured to generate a Hall voltage between at least one pair of the plurality of pickups, wherein the Hall voltage is most responsive to a magnetic field directed parallel to a major surface of the substrate.

In accordance with another aspect, a Hall Effect element disposed over a substrate includes an N-type epitaxial layer disposed over the substrate. The Hall Effect element also includes a plurality of pickups implanted and diffused into the epitaxial layer, adjacent pairs of the plurality of pickups separated by separation regions, each one of the plurality of pickups comprising a respective N-plus type diffusion. The Hall Effect element also includes an N-type pre-epitaxial implant layer implanted and diffused into the substrate and disposed under the epitaxial layer. The Hall Effect element is configured to generate a Hall voltage between at least one pair of the plurality of pickups, wherein the Hall voltage is most responsive to a magnetic field directed parallel to a major surface of the substrate.

In accordance with another aspect, a Hall Effect element disposed over a substrate includes a first N-type epitaxial layer disposed over the substrate. The Hall Effect element also includes a second N-type epitaxial layer disposed over the first epitaxial layer. The Hall Effect element also includes a plurality of pickups implanted and diffused into the second epitaxial layer, adjacent pairs of the plurality of pickups separated by separation regions, each one of the plurality of pickups comprising a respective N-plus type diffusion.

In accordance with another aspect, a method of fabricating a Hall Effect element disposed over a substrate includes depositing an N-type epitaxial layer over the substrate. The method also includes implanting and diffusing a plurality of pickups into the epitaxial layer, adjacent pairs of the plurality of pickups separated by separation regions, each one of the plurality of pickups comprising a respective N-plus type diffusion. The method also includes implanting and diffusing a plurality of Light-N regions into the epitaxial layer, each one of the plurality of Light-N regions disposed under a respective one of the plurality of pickups. The Hall Effect element is configured to generate a Hall voltage between at least one pair of the plurality of pickups, wherein the Hall voltage is most responsive to a magnetic field directed parallel to a major surface of the substrate.

In accordance with another aspect, a method of fabricating a Hall Effect element disposed over a substrate includes depositing an N-type epitaxial layer over the substrate. The method also includes implanting and diffusing a plurality of pickups into the epitaxial layer, adjacent pairs of the plurality of pickups separated by separation regions, each one of the plurality of pickups comprising a respective N-plus type diffusion. The method also includes implanting and diffusing an N-type pre-epitaxial implant layer into the substrate and under the epitaxial layer. The Hall Effect element is configured to generate a Hall voltage between at least one pair of the plurality of pickups, wherein the Hall voltage is most responsive to a magnetic field directed parallel to a major surface of the substrate.

In accordance with another aspect, a method of fabricating a Hall Effect element disposed over a substrate includes depositing a first N-type epitaxial layer over the substrate. The method also includes depositing a second N-type epitaxial layer over the first epitaxial layer. The method also includes implanting and diffusing a plurality of pickups into the second epitaxial layer, adjacent pairs of the plurality of pickups separated by separation regions, each one of the plurality of pickups comprising a respective N-plus type diffusion. The Hall Effect element is configured to generate a Hall voltage between at least one pair of the plurality of pickups, wherein the Hall voltage is most responsive to a magnetic field directed parallel to a major surface of the substrate.

BRIEF DESCRIPTION OF THE DRAWINGS

The foregoing features of the invention, as well as the invention itself may be more fully understood from the following detailed description of the drawings, in which.

DETAILED DESCRIPTION OF THE INVENTION

Figure 1:
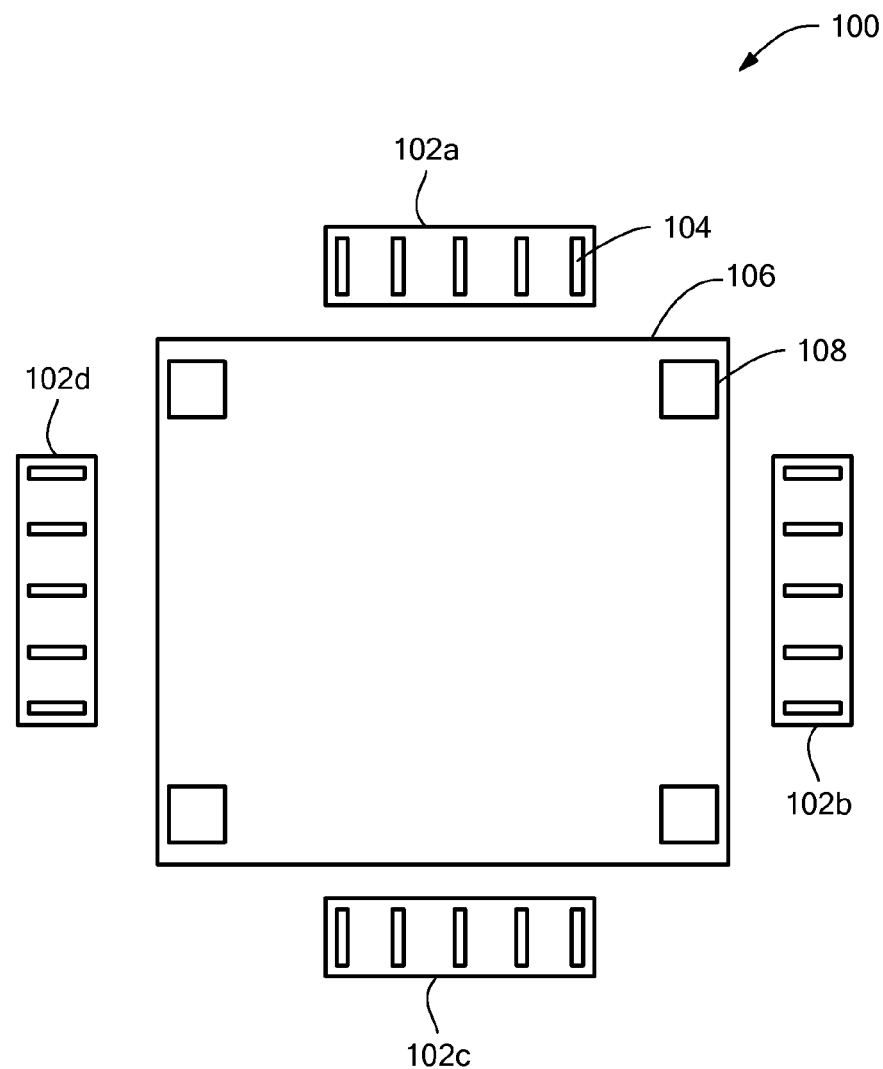
FIG. 1 is a block diagram showing a top view of a combination of a planar Hall Effect element with four vertical Hall Effect elements, resulting in a structure that can, in combination with electronics (not shown), can generate an output signal representative of a magnitude of magnetic field vector in three-dimensional space.

Before describing the present invention, some introductory concepts and terminology are explained. As used herein, the term "substrate" is used to describe any type of structure with a flat surface upon which semiconductor materials can be deposited and/or into which semiconductor materials can be implanted and diffused. In some embodiments, the substrate is a P-type silicon substrate having a particular range of concentrations of P-type atoms (i.e., ions)

As used herein, the term "epi" is used to refer to an epitaxial layer, for example, an N-type epitaxial layer, disposed over a substrate, for example, a P-type substrate, and having a particular range of concentrations of N-type atoms (i.e. ions).

As used herein, the term "N+" or "NP" is used to refer to a region implanted and diffused into a semiconductor layer, for example, into a surface of the epitaxial layer furthest from the substrate, and having another particular range of concentrations of N-type atoms (i.e. ions).

As used herein, the term "Light-N" or simply "LN" is used to refer to a region implanted and diffused into a semiconductor layer, for example, into a surface of the epitaxial layer further from the substrate, and having a particular range of concentrations of N-type atoms (i.e. ions).

As used herein, the term "N+" or "NP" is used to refer to a region implanted and diffused into a semiconductor layer, for example, into a surface of the epitaxial layer furthest from the substrate, and having another particular range of concentrations of N-type atoms (i.e. ions).

As used herein, the term "P-well" is used to refer to a region implanted and diffused into a semiconductor layer, for example, into a surface of the epitaxial layer further from the substrate, and having a particular range of concentrations of P-type atoms (i.e. ions).

As used herein, the term "Light-P" or simply "LP" is used to refer to a region implanted and diffused into a semiconductor layer, for example, into a surface of the epitaxial layer further from the substrate, and having a particular range of concentrations of P-type atoms (i.e. ions).

As used herein, the term "P-type buried layer" or simply "PBL" is used to refer to a region implanted and diffused into a semiconductor layer, for example, implanted into the substrate and then upwardly diffused into the epitaxial (epi) layer (also referred to herein as an epi layer). The epi layer can be grown after PBL implant and diffusion steps, and the upward diffusion into epi layer can be performed during a field oxidation process.

As used herein, the term "P+" or "PP" is used to refer to a region implanted and diffused into a semiconductor layer, for example, into a surface of the epitaxial layer furthest from the substrate, and having another particular range of concentrations of P-type atoms (i.e. ions).

As used herein, the concentrations of the above types of semiconductor structures fall into the following ranges:

substrate=about $1 \times 10^{15}$ P-type atoms per cm$^3$, for example, boron atoms.

epi=about $1 \times 10^{15}$ to about $6 \times 10^{15}$ N-type atoms per cm$^3$, for example, Arsenic atoms,
  where: $5 \times 10^{14}$ to $1 \times 10^{15}$ can be representative of a concentration of epi bulk doping, and $5 \times 10^{15}$ to $1 \times 10^{16}$ can be representative of a concentration at a surface region of the epi layer at about 2 um depth created by an additional epi implant step. (Alternatively, $1 \times 10^{15}$ to $6 \times 10^{15}$).

N+=about $1 \times 10^{20}$ N-type atoms per cm$^3$, for example, phosphorous atoms.

LN=about 1 to $2 \times 10^{17}$ atoms per cm$^3$, for example, phosphorous atoms.

P-well=about $1 \times 10^{16}$ P-type atoms per cm$^3$, for example, boron atoms.

LP=about $5 \times 10^{17}$ atoms per cm$^3$, for example, boron atoms.

PBL=about $1 \times 10^{18}$ to about $2 \times 10^{18}$ P-type atoms per cm$^3$, for example, boron atoms.

P+=about $3 \times 10^{19}$ to about $5 \times 10^{19}$ P-type atoms per cm$^3$, for example, boron atoms.

In some embodiments, the concentrations are outside of the above ranges or values, but within about +/− twenty percent of the above ranges or values.

Before describing the present invention, it should be noted that reference is sometimes made herein to assemblies having a particular shape (e.g., rectangular). One of ordinary skill in the art will appreciate, however, that the techniques described herein are applicable to a variety of sizes and shapes.

Referring to FIG. 1, an exemplary Hall Effect element combination 100 includes a planar Hall Effect element 106 and also four vertical Hall affects elements 102a, 102b, 102c, 102d. The planar Hall Effect element 106 can include, for example, four pickups of which a pickup 108 is but one example. Pickups are described more fully below in conjunction with FIGS. 2 and 3. Each one of the vertical Hall Effect elements 102a, 102b, 102c, 102d can include, for example, five pickups, of which a pickup 104 is but one example. It will, however, be understood that, in particular, the vertical Hall Effect elements 102a, 102b, 102c, 102d can have any number of pickups greater than five pickups. Structure of the vertical Hall Effect elements 102a, 102b, 102c, 102d is described more fully below in conjunction with FIGS. 2, 3, 3A, 4, 4A, and 4B.

It will be understood that the above-described pickups 108, 104 are semiconductor structures to which electrical connections can be made. It will also be understood that outer boundaries of the planar Hall Effect element 106 and boundaries of the vertical Hall Effect elements 102a, 102b, 102c, 102d are generally defined by edges of respective epitaxial (epi) regions bounded by respective isolation regions defined, for example, by respective P+, LP, P− well and PBL regions (not shown) surrounding the epi regions. Such regions are described below in conjunction with FIG. 3.

As described above, the planar Hall Effect element 106 can have an axis of maximum sensitivity that is perpendicular to the page, i.e., perpendicular to a substrate on which the planar Hall Effect element 106 is formed. In contrast, the vertical Hall Effect elements 102a, 102c can have respective axes of maximum sensitivity that are parallel to the page, i.e., parallel to the substrate on which the vertical Hall Effect elements 102a, 102c are formed, and, in particular in a direction up and down on the page (in a portrait orientation). Similarly, the vertical Hall Effect elements 102b, 102d can have respective axes of maximum sensitivity that are parallel to the page, i.e., parallel to the substrate on which the vertical Hall Effect elements 102b, 102d are formed, and, in particular in a direction side to side on the page (in a portrait orientation).

Thus, with a Hall Effect element combination 100, it will be understood that the signals can be generated that are representative of x, y, and z magnitude components of the magnetic field vector having three dimensions. While processing electronics are not shown, it will be understood that electronics can be used to receive and process signals from the Hall Effect element combination 100 and to generate an electronic signal representative of a magnitude of the magnetic field vector having the three dimensions. Furthermore, the pointing direction of the magnetic field vector can be determined by the electronics.

While four vertical Hall Effect elements 102a, 102b, 102c, 102d are shown, other embodiments can use as few as two vertical Hall Effect elements, or more than four vertical Hall Effect elements.

Figure 2:
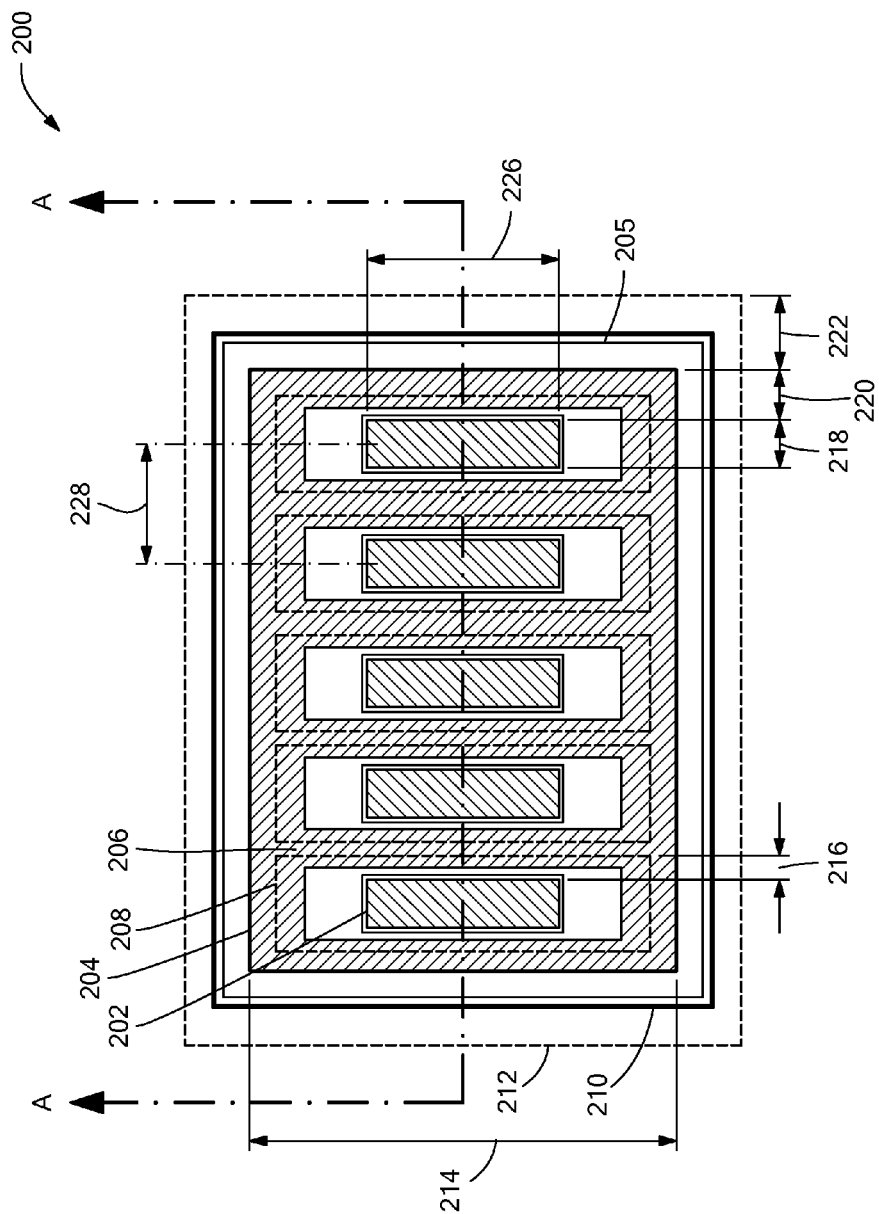
FIG. 2 is a block diagram showing a cross-sectional top view of a vertical Hall Effect element of FIG. 1, the vertical Hall element having a plurality of pickups, each pickup in proximity to a respective Light-N (LN) region, also having a Light-P (LP) region, and also having a pre-epi layer and/or having two epi layers.
Figure 3:
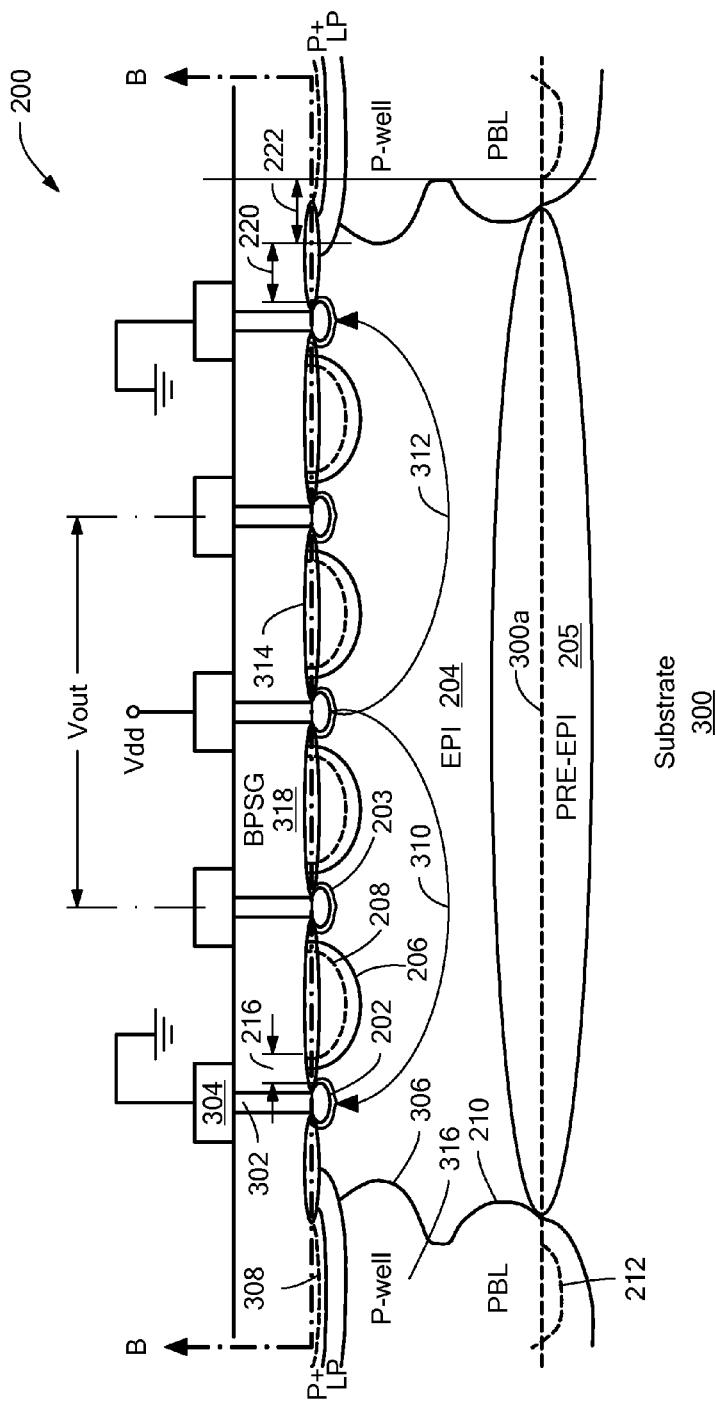
FIG. 3 is a block diagram showing a vertical cross section of the vertical Hall Effect element of FIG. 2, which has the pre-epi layer.

Referring now to FIGS. 2 and 3 together, for which FIG. 2 shows a cross-sectional top view along a section line BB of FIG. 3 and FIG. 3 shows a cross-sectional side view along a section line A-A of FIG. 2, and in which like elements are shown having like reference designations, a vertical Hall Effect element 200 can be the same as or similar to any one of the vertical Hall Effect elements 102a, 102b, 102c, 102d of FIG. 1. The vertical Hall Effect element 200 can be used alone, or alternatively, in combination with any other number of planar or vertical Hall Effect elements.

The vertical Hall element 200 is representative of the vertical Hall element at an intermediate step of integrated circuit fabrication. In particular, the vertical Hall element 200 does not show additional layers and structures that may be formed over the vertical Hall element 200.

In addition, the vertical Hall element 200 does not show some structures that are temporary, for example, photo resist masks, which can be removed during the fabrication process of the vertical Hall element 200. Accordingly, reference may be made below to patterning that uses photo resist masks to provide openings for implant steps. However, in other instances described below, a field oxide layer can be used to provide openings for some implant and diffusion steps.

The vertical Hall Effect element 200 of FIG. 3 can be constructed over a substrate 300, in particular, within and upon an epitaxial (epi) region 204 (also referred to herein as an epi layer) disposed upon a surface 300a of the substrate 300.

Figure 3A:
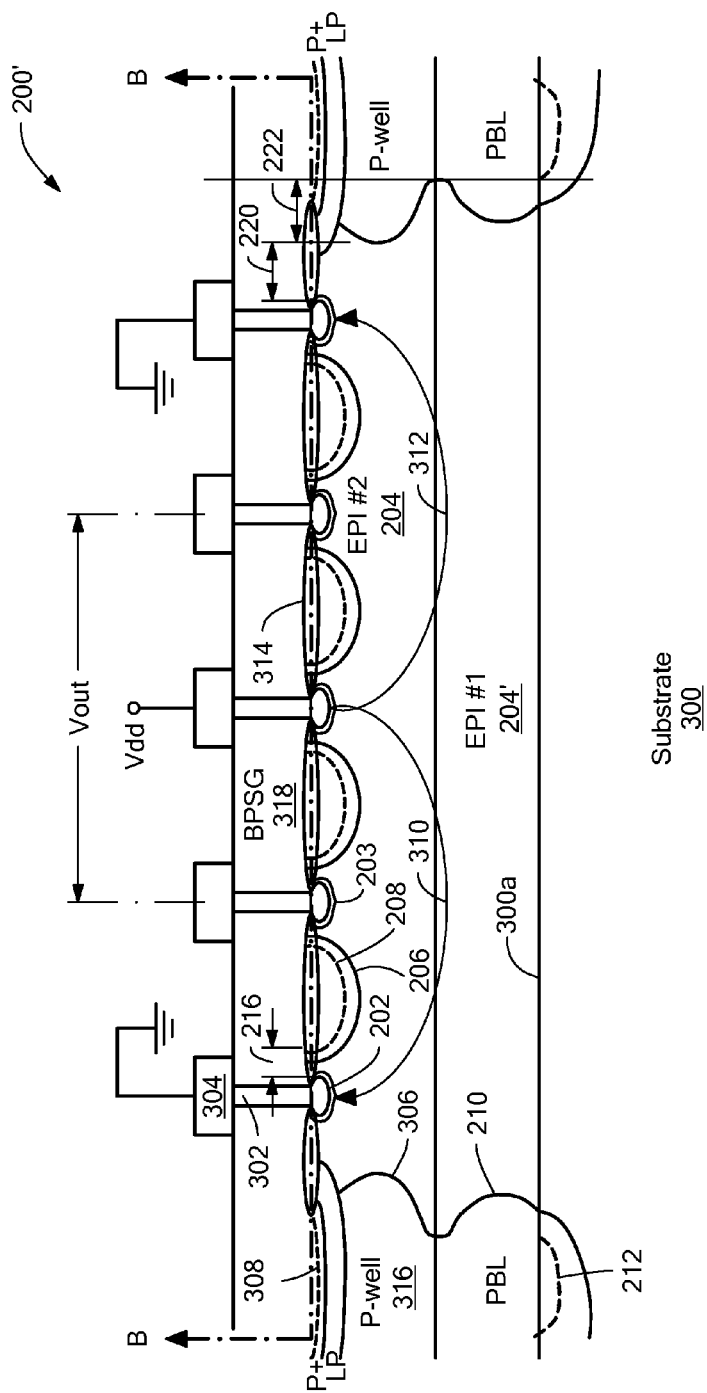
FIG. 3A is a block diagram showing a vertical cross section of the vertical Hall Effect element of FIG. 2, which has the two epi layers.
Figure 3B:
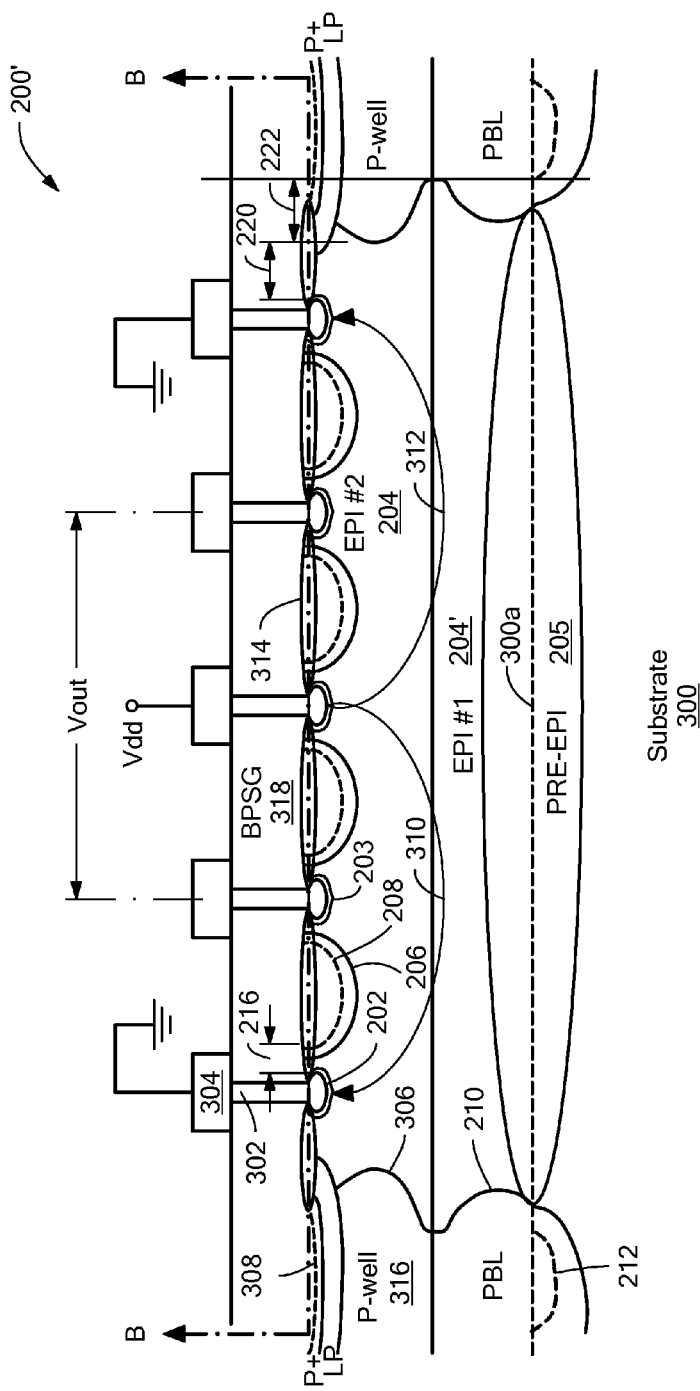
FIG. 3B is a block diagram showing a vertical cross section of the vertical Hall Effect element if FIG. 2, which has the pre-epi layer and the two epi layers.

The vertical Hall Effect element 200 of FIGS. 2, 3, and 3B can include a so-called "pre-epi" region 205 comprised of an N-type material deposited upon and diffused into the substrate 300. A concentration of the pre-epi region (also referred to herein as a pre-epi layer) can be within about +/−20 percent of $1 \times 10^{15}$ N-type atoms per $cm^3$, for example, Phosphorus atoms.

An outer horizontal boundary of the epi region 204 is determined by an inner edge (closest to the pickups) of a P-well region 306 that surrounds the pickups. The P-well region 306 is implanted and diffused into the epi region 204 from a surface of the epi region 204 furthest from the substrate 300. A dashed line 308 is representative of an edge of the P-well region 306 after it is implanted into the epi region 204, but before it is diffused by heating steps in fabrication of the vertical Hall Effect element 200. P+ and LP regions may result over the P-well region 306.

In some embodiments, the P-well implant 308 is formed in conjunction with a photo resist mask that provides openings for the implantation, and which is later removed. In some embodiments, the P-well implant 306 is performed prior to growth of a field oxide layer 314 described more fully below.

The vertical Hall Effect element 200 can include five so-called "pickups," of which the pickup 202 is representative. As used herein, the term "pickup" is used to describe an N+ active region implanted and diffused into a semiconductor structure, i.e., into an outer surface of the epi region 204, and which is used to provide an area at which an electrical signal is received from the semiconductor structure or at which an electrical signal is input to the semiconductor structure. In particular, the pickup 202 is an active or device region first defined by a "device" photo resist mask, which is thereafter removed.

The vertical Hall Effect element 200 can include five LN regions, of which an LN region 203 is representative. The LN regions are disposed under respective ones of the N+ pickups, e.g. 202. Thus, the number of LN regions is selected in accordance with the number of pickups.

Placement of the device photo resist mask (not shown) and implantation of the N+ pickups and the LN regions can be preceded by formation of the field oxide layer 314 over an upper surface of the epi region 204. Openings can be provided (i.e., etched) through the field oxide layer 314 by way of the device photo resist mask, the openings for implantation of the pickups, e.g., 202, and the LN regions, e.g. 203. Openings through the field oxide layer 314 may be provided over the P-well region 306 for the masked P+ implant.

An LP region 206 is implanted and diffused into the outer surface of the epi region 204. A dashed line 208 is representative of the LP region 206 after it is implanted into the epi layer 204 but before it is further diffused. The further diffusion results in the LP region 206 becoming closer to the pickup 202. The LP region 206 can be defined by a photo resist mask, which is thereafter removed and is not shown.

In some embodiments, placement of the photo resist mask (not shown) and implantation of the LP region 206 is preceded by formation of the above-described field oxide layer 314 over the upper surface of the epi region 204, and the diffusion of the LP region 206 takes place through the field oxide layer 314 and into the epi region 204. Thus, in some embodiments, openings though the field oxide layer 314 are not provided for the LP region 206.

The LP region 206 can be comprised of one contiguous LP region 206 with different parts. In other embodiments, the LP region 206 can be comprised of separate non-contiguous parts.

The LP region 206 extends into so-called "separation regions" between the pickups, e.g., 202.

A vertical Hall element having an LP region, the LP region alone resulting in an improved sensitivity, is described in U.S. patent application Ser. No. 13/752,681, filed Jan. 29, 2013, and entitled "A Vertical Hall Effect Element with Improved Sensitivity," which is assigned to the assignee of the present invention, and which is incorporated by reference herein in its entirety.

A borophosphosilicate glass (BPSG) layer, i.e., a doped oxide, 318 can be deposited over the top of the field oxide and its opening regions (pickups) 204. This BPSG layer in the vertical Hall element 200 provides a separation and isolation between the layers shown and additional layers not shown.

The BPSG layer 318 can be masked (e.g., with a contact mask) and etched to form openings through the BPSG layer 318, which are so-called "contacts" described below. As described above, openings through the field oxide layer are created and defined with a "device" mask or an "active" mask over the pickups, e.g., the pickup 202, and it is through those openings that the pickups 202 are originally formed with N+ implant and diffusion steps prior to the BPSG deposition. Similarly, the masked P+ implant and diffusion can be formed in the outer isolation region over the field oxide opening there.

Associated with each one of the pickups, for example, with the pickup 202, is a so-called "contact," of which a contact 302 is representative. As used herein, the term "contact" is used to describe a metallized connection of a semiconductor structure, for example, metal plating over contact openings through the BPSG layer 318. The contact, e.g., 302, provides a low resistance electrical coupling to a pickup, e.g., to the pickup 202.

A contact opening can have a width smaller than a width of the pickup 202. While one contact is shown for each pickup, in other embodiments, there can be a plurality of contacts in electrical communication with an associated pickup.

Associated with and electrically coupled to each one of the contacts, for example, with the contact 302 (or with a plurality of contacts coupled to the pickup 202), is a metal structure, or simply "metal," of which a metal 304 is representative. As used herein, the term "metal" is used to describe a portion of a metal layer of a semiconductor structure used to provide a low resistance electrical coupling to a contact, e.g., to the contact 302.

The top view of FIG. 2 is a horizontal cross section taken along section line B-B of FIG. 3, and thus, does not include the metal 304.

A PBL structure 210 (also referred to herein as a P-type barrier layer region) is implanted over the substrate 300 before placement of the epi region 204. A dashed line 212 is representative of the PBL structure 210 after it is implanted into the substrate 300, but before it is diffused by heating steps in fabrication of the vertical Hall Effect element 200.

The PBL structure 210 joins with or merges with the P-well region 306 in a region 316 forming a barrier to electrical charges that move within the epi layer 204 during operation of the vertical Hall Effect element 200.

As described above, adjacent pairs of the plurality of pickups are separated by so-called separation regions, e.g., a region in which the LP region 206 is disposed. Each one of the plurality of pickups, e.g., pickup 202, is comprised of an N+ implant and diffusion.

Other layers 318 can also be disposed over the epi region 204. In some embodiments the other layers 318 include one or more interlayer dielectric (ILD) layers, one or more metal layers, e.g., M2 or and M3 layers, and a passivation layer, none of which are shown.

It will be appreciated that the metals 304 are on a so-called metal one M1 layer, in which case the BPSG layer 318 can be used. However, between different metal layers, the oxide between layers is called an interlayer dielectric (ILD) layer.

The vertical Hall Effect element 200 can be coupled to receive a power supply voltage Vdd, for example, at a center metal structure, and can be coupled to a reference voltage, for example, a ground reference voltage, at another two metal structures. Currents 310, 312 result.

In operation, an output voltage Vout is proportional to a magnetic field experienced by the vertical Hall Effect element in a direction into the page of FIG. 3.

It will be understood that a sensitivity of the vertical Hall Effect element 200 is related to vertical portions of the currents 310, 312, i.e., portions of the current paths that are perpendicular to the substrate 300 of FIG. 3. Thus, in order to provide more sensitivity, the vertical portions of the currents 310, 312 should be increased in physical length. The LP regions, e.g., 206, provide a blockage of portions of the currents 310, 312 that might otherwise flow horizontally directly between the center pickup and the end pickups. Thus, the LP regions, e.g., 206, cause the currents 310, 312 to have more extended vertical regions than would otherwise be available. A higher sensitivity vertical Hall Effect element 200 results.

The pre-epi region 205 of FIG. 3 provides a deeper low resistance path for the currents 310, 312, resulting in current paths with longer vertical or near vertical portions, and therefore, resulting in a higher sensitivity vertical Hall element.

The LN regions, e.g., 203, also tend to result in the currents 310, 312 having more vertical, or near vertical, orientations proximate to the pickups, e.g., 202, also resulting in a higher sensitivity vertical Hall element. The LN regions reduce resistance locally right underneath the pickups, which tends to enhance the vertical portion of the current flow.

It should be appreciated that the LP region 206, the pre-epi region 205, and the LN regions, e.g., 203, (and also a double epi region described below in conjunction with FIG. 3A) can each contribute to a higher sensitivity vertical Hall element. It should also be appreciated that the LP region 206, the pre-epi region 205, the LN regions, e.g., 203 (and also the double epi region described below in conjunction with FIG. 3A) can be used separately or in any combination to achieve a higher sensitivity vertical Hall element than would otherwise be achieved.

In some embodiments, a distance 228 (Sp_pkpk) between centers of adjacent pickups is within about +/− ten percent of 3.5 micrometers.

In some embodiments, a distance 220 (Es_pkep) between an edge of an outer one of the plurality of pickups, e.g., 206, and a closest edge of the P-well region 306 (that defines the edge of the epi region 204) is within about +/− ten percent of 5.5 micrometers.

In some embodiments, a distance 216 (Sp_pklp) between an edge of each one of the pickups, e.g., 202, and a closest edge of a closest LP region, e.g., 206, before it is diffused, see, e.g., 208, into the epi region 204 is within about +/− ten percent of 0.4 micrometers. It will be understood that the LP regions, e.g., 206, after diffusion should not touch the pickups, e.g., the pickup 202.

In some embodiments, a height 226 (PKH) of each pickup, e.g., 202, is within about +/− ten percent of 9.0 micrometers.

In some embodiments, a width 218 (PKW) of each pickup, e.g., 202, is within about +/− ten percent of 1.0 micrometers.

In some embodiments, a smallest distance 222 (SP_eppb) between an outer edge of the epi region 204 and a closest edge of the PBL structure 210 in a direction parallel to the major surface of the substrate before PBL structure is diffused, see, e.g., 212, is within about +/− ten percent of 5.0 micrometers. By spacing the PBL structure in this way away from the currents 310, 312, outer vertical portions of the currents 310, 312 can remain more vertical, resulting in a more sensitive vertical Hall Effect element.

In some embodiments, a width 214 (EP_width) of the epi region 204, i.e., a distance between opposite edges of the P-well region 306 is within about +/− ten percent of 20.0 micrometers.

The above combination of doping concentration and dimensions can result in a vertical Hall Effect element having a sensitivity of about five to six microvolts per Gauss per volt.

While the vertical Hall Effect element 200 is shown to include five pickups, in other similar embodiments, a vertical Hall Effect element can include any number of pickups more than five pickups, with a corresponding number of LN regions proximate to the pickups. It will be understood how to drive the other embodiments of vertical Hall Effect elements and it will be understood how to receive output signals from the other embodiments of vertical Hall Effect elements.

In some embodiments, in operation, the vertical Hall Effect element 200 is "chopped." It will be understood that chopping is an arrangement by which, at some times a selected pickup of the vertical Hall Effect element 200 is driven and at other times a different selected pickup is driven. Similarly, at some times an output signal is generated between a certain pair of the pickups, and at other times an output signal is generated between the different pair of the pickups. It will further be understood that the chopping arrangement is often used with both planar and vertical Hall Effect elements to result in a reduction of the DC offset voltage.

In some embodiments, a particular non-limiting sequence of fabrication steps can be used to fabricate the vertical Hall Effect element 200. However, additional layers and additional steps can also be used.

1. Implant PBL 212 upon substrate 300.
2. Implant pre-epi region 203.
3. Grow epi region 204 of about 6.0 um in thickness (range 5.5 um-6.5 um) with bulk doping level of about $1 \times 10^{15}$.
4. Shallow implant epi region 204 to make concentration about $5 \times 10^{15}$ to $6 \times 10^{15}$ within 2 um depth.
5. Mask and implant P-well region 308.
6. Device mask and grow field oxide, which diffuses PBL upward into epi layer and P-well downward into epi layer until merged 210, 306, 316.
7. Mask for LP implant 208 and diffuse LP to provide the LP region 206 and also in outer isolation region.
8. Masked implant LN regions 203.
9. Masked implant N+ pickups 202, and masked P+ implant over the outer isolation region.
10. Deposit BPSG 318 over field oxide layer.
11. Open contacts 302 (i.e., etch though BPSG layer 318), and deposit metal layer 304 and patterning (masked M1 etch).
12. Deposit interlayer dielectric (ILD), via openings, and other top metal layers (not shown).
13. Deposit passivation layer and patterning (not shown).

Referring now to FIG. 3A, in which like elements of FIGS. 2 and 3 are shown having like reference designations, a vertical Hall element 200' is similar to the vertical Hall element 200. The vertical Hall element 200 of FIGS. 2 and 3 is distinguished by having a pre-epi region 205 diffused into a substrate 300 and under the epi layer 204. The vertical Hall element 200' of FIG. 3A is distinguished by having two epi regions 204, 204' over the substrate 300, and not having a pre-epi region. However, it will be apparent that, in other embodiments (such as the embodiment of FIG. 3B), the pre-epi region 205 can be used in conjunction with the two epi regions 204, 204' of FIG. 3A. Other structures in the vertical Hall elements 200, 200' can be the same.

In some embodiments, the two epi regions 204, 204' of FIG. 3A each have thicknesses in the range of about 5.5 to 6.5 um.

The double epi layers 204, 204' of FIG. 3A provide a deeper low resistance path for the currents 310, 312, resulting in current paths with longer vertical or near vertical portions, and therefore, resulting in a higher sensitivity vertical Hall element.

Figure 4:
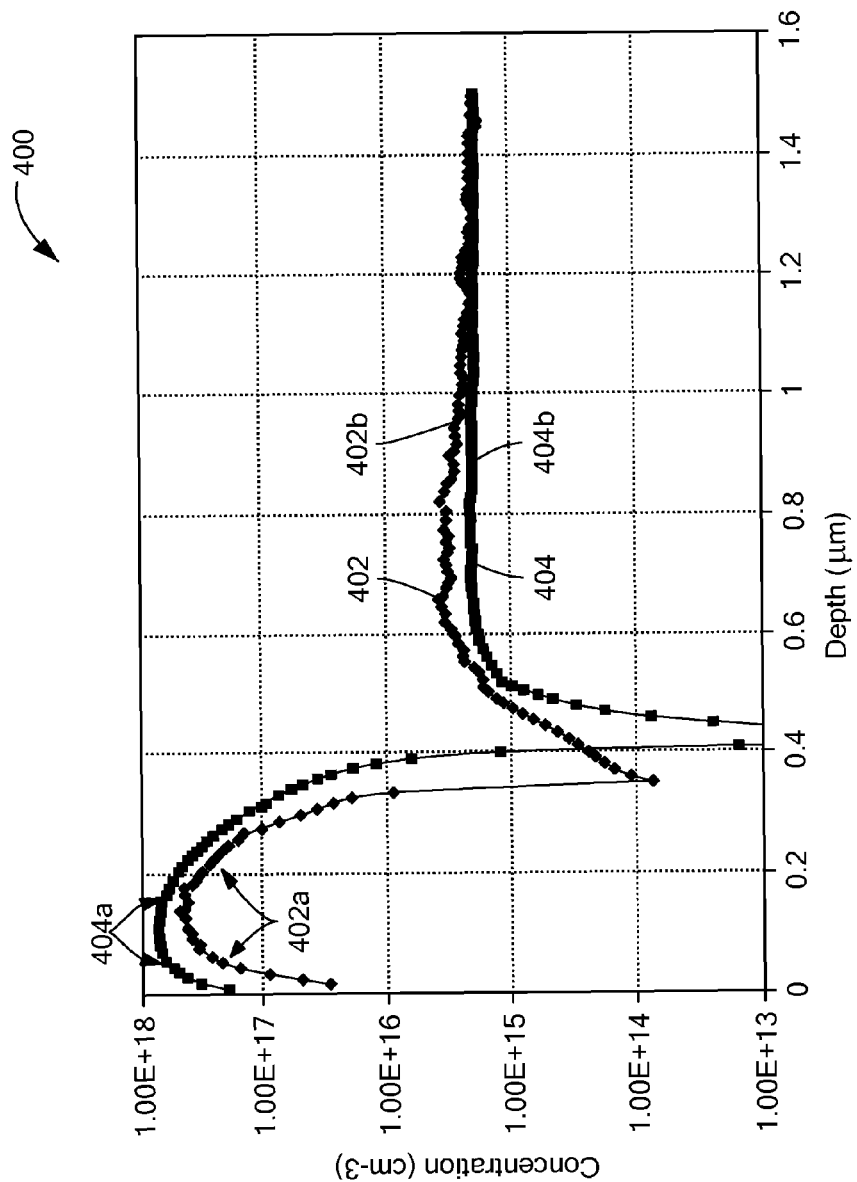
FIG. 4 is a graph showing an exemplary concentration versus depths of the LP region of the Fall Effect element of FIGS. 2, 3, 3A, and 3B.

Referring now to FIG. 4, a graph 400 has a vertical axis with a scale in units of doping concentration in units of atoms (i.e., ions, per cubic centimeter), and a horizontal axis with a scale in units of depth into the epi region 204 of FIGS. 2 and 3. Portions 402a, 404a of curves 402, 404 (TCAD simulation vs. real measured doping profile, respectively) are each representative of exemplary doping profiles for the LP region 206 of FIGS. 2 and 3, after diffusion into the epi region 204.

As indicated above, the peak doping concentration of the LP region 204 is about $5 \times 10^{17}$ in log scale at about 0.1 um below the surface of the epi region 204 of FIGS. 2 and 3. Tail ends 402b, 404b of the curves 402, 404 are representative of the doping concentrations of the underlying epi region 204, i.e., about $1.5 \times 10^{15}$.

As described above in conjunction with FIGS. 3 and 3A, it is vertical portions of the currents 310, 312 that contribute most to sensitivity of the vertical Hall Effect elements 200, 200'. It is further discussed above that the LP region, e.g., 206, forces the currents 310, 312 more downward, and more vertically, within the EPI region 204. Accordingly, diffusion depth of the LP region 206 is important. If the LP region 206 is too shallow, it has little effect upon directing the currents 310, 312 downward and more vertically. If the LP region 206 is too deep, due to sideways diffusion of the LP region 206 when diffused more deeply, the pickups must be more widely spaced, and the currents 310, 312 have longer paths and may be reduced in magnitude, resulting in low Hall sensitivity.

Diffusion depth of the LP region 206 is deep enough to force the currents 310, 312 more vertically and downward. Other diffusion types, for example, a P+ type diffusion (which is similar in depth to an N+ type diffusion, both are commonly used for source/drain doping in the CMOS process), if used in place of the LP region 206, would tend to be too shallow, and therefore, would tend not to drive the currents 310, 312 sufficiently downward, and little improvement in sensitivity may result. Conversely, a P-well, if used in place of the LP region 206, would tend to be too deep, and therefore, the pickups must be more widely spaced, and the current paths 310, 312 would be longer and face higher resistance, and again, little improvement or lowering in sensitivity may result.

Figure 4A:
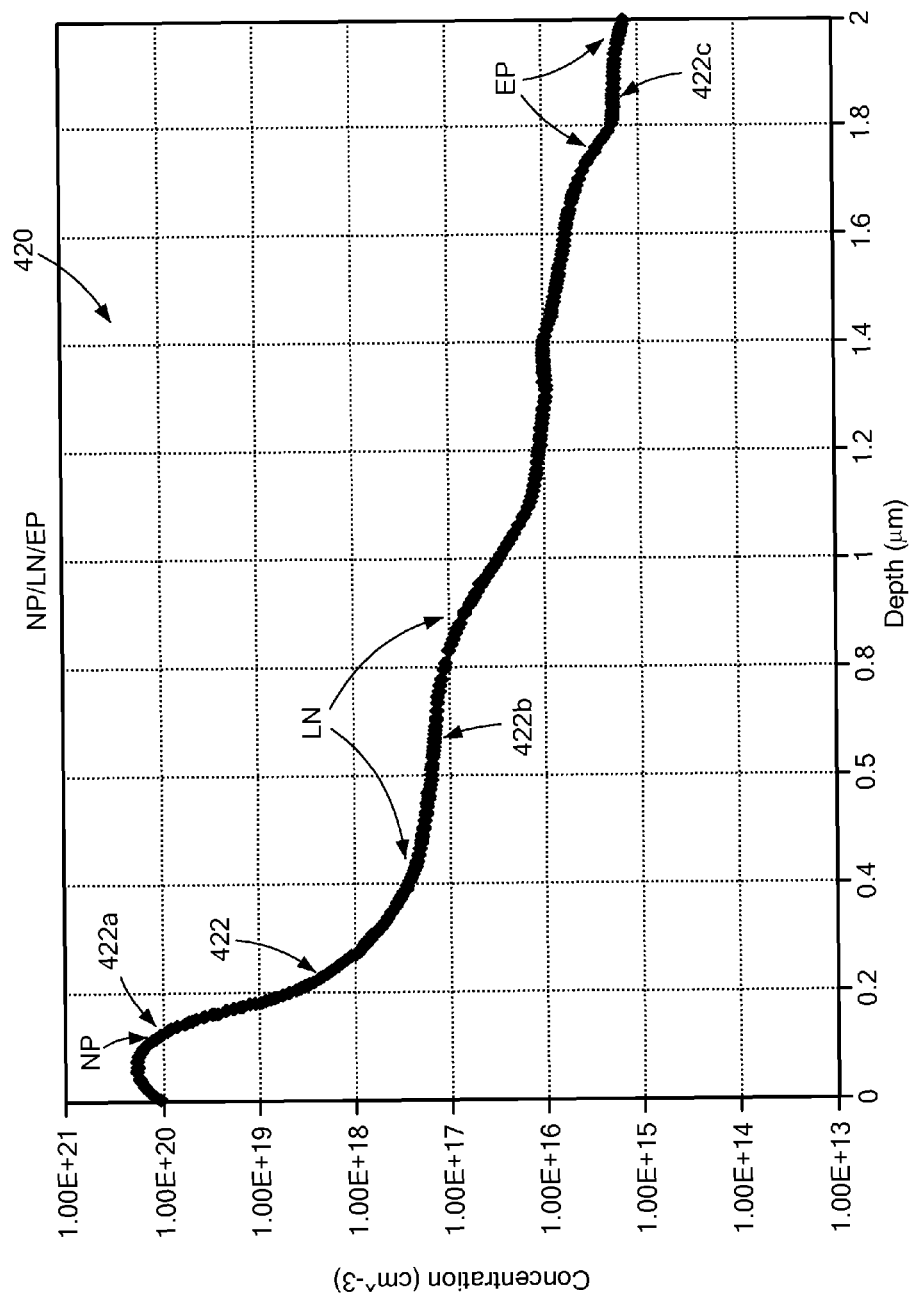
FIG. 4A is a graph showing an exemplary concentration versus depth of the LN region of the Hall Effect element of FIGS. 2, 3, 3A, and 3B.

Referring now to FIG. 4A, a graph 420 has a vertical axis with a scale in units of doping concentration in units of atoms (i.e., ions, per cubic centimeter), and a horizontal axis with a scale in units of depth into the epi region 204 of FIGS. 2, 3, 3A, and 3B. A curve 422 is representative of an exemplary doping profile showing a transition from the N+(NP) contacts in curve region 424a (see, e.g. 202 of FIGS. 2, 3, 3A, and 3B), to the LN regions in curve region 422b (see, e.g., 203 of FIGS.

2, 3, 3A, and 3B), to the epi region in curve region 422c (see, e.g., 402 in FIGS. 2, 3, 3A, and 3B).

As indicated above, the peak doping concentration of the LN region 204 is about $2 \times 10^{17}$ in log scale at about 0.4 um below the surface of the epi region 204 of FIGS. 2, 3 3A, and 3B. A tail end of the curve 422 is representative of the doping concentration of the underlying epi region 204, i.e., about $1.5 \times 10^{15}$.

Figure 4B:
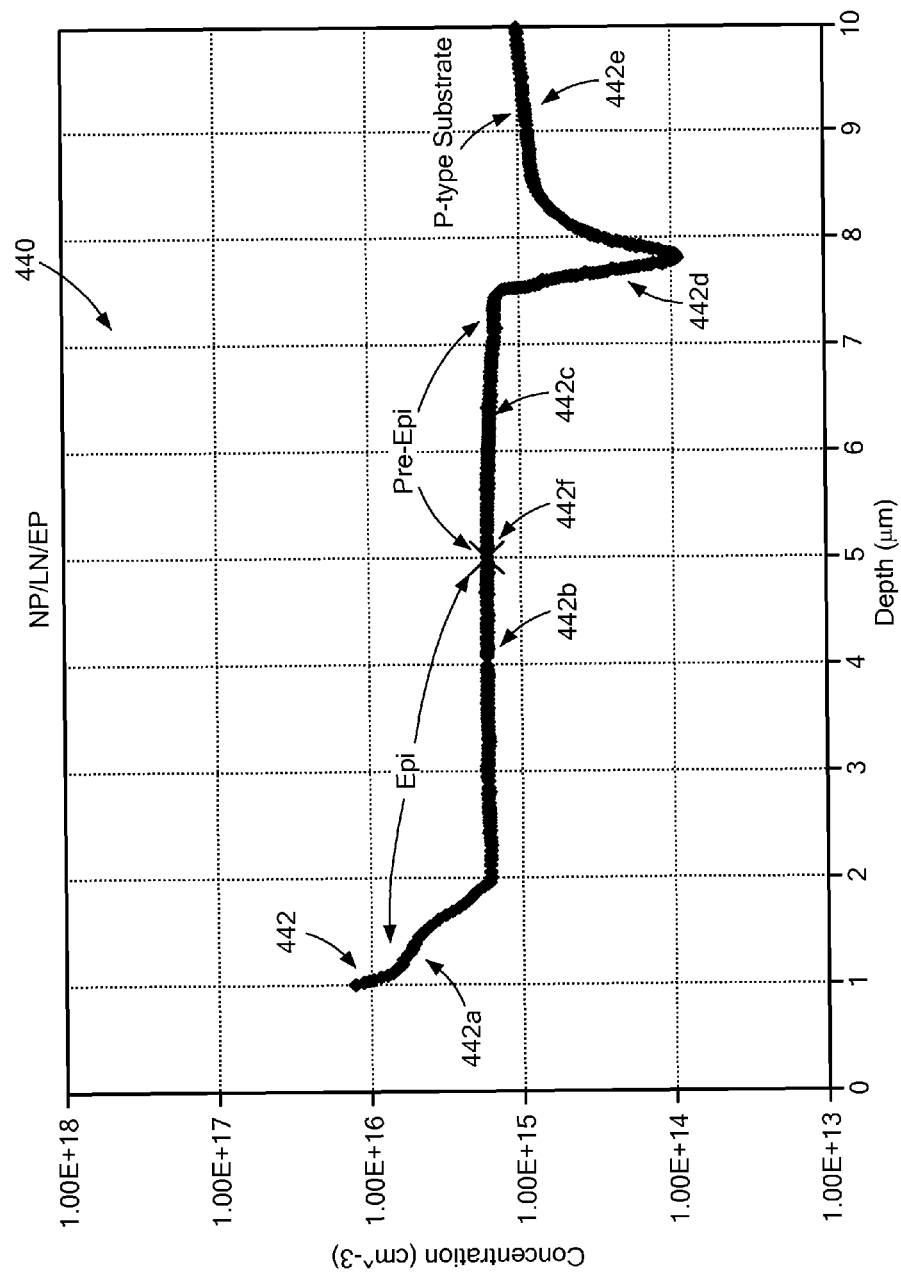
FIG. 4B is a graph showing an exemplary concentration versus depth of the pre-epi layer of FIGS. 2, 3, and 3B.

Referring now to FIG. 4B, a graph 440 has a vertical axis with a scale in units of doping concentration in units of atoms (i.e., ions, per cubic centimeter), and a horizontal axis with a scale in units of depth into the substrate 300 of FIGS. 2, and 3. A depth of zero corresponds to an outer surface of the epi layer 204 of FIGS. 2 and 3. A curve 442 is representative of an exemplary doping profile of the epi layer 204 with the pre-epi implant 205 of FIGS. 2 and 3.

A curve region 442a is representative of doping near the outer surface of the epi region 204 of FIGS. 2 and 3. The curve region 442 has a high doping concentration representative of high doping of the pickups (e.g., 202, FIG. 3) and of the LN regions (e.g., 203, FIG. 3), which are each diffused into the epi layer 204.

A flat curve region 442b, up to an indicator 442f, is representative of doping concentration of the epi layer 204, and a flat curve region 442c, after the indicator 442f, is representative of doping concentration of the pre-epi region 205 of FIGS. 2 and 3. The indicator 442f is shown at a depth that would be achieved by the epi layer 204 without the pre-epi region 205.

A dip 444d in the curve 442 is representative of a change from N-type doping of the pre-epi region 205 to the P-type doping of the substrate 300 of FIGS. 2 and 3. Without the pre-epi region 205, the dip 442d would occur at a shallower depth, for example, at about five micrometers beneath the outer surface of the epi region 204, i.e., at a depth represented by the indicator 442f.

A curve region 442e is representative of P-type doping of the substrate 300 of FIGS. 2 and 3.

As indicated above, the doping concentration of the pre-epi implant 205 is about $2 \times 10^{15}$ in log scale, which can be the same as or similar to the doping of the epi layer 204.

Figure 5:
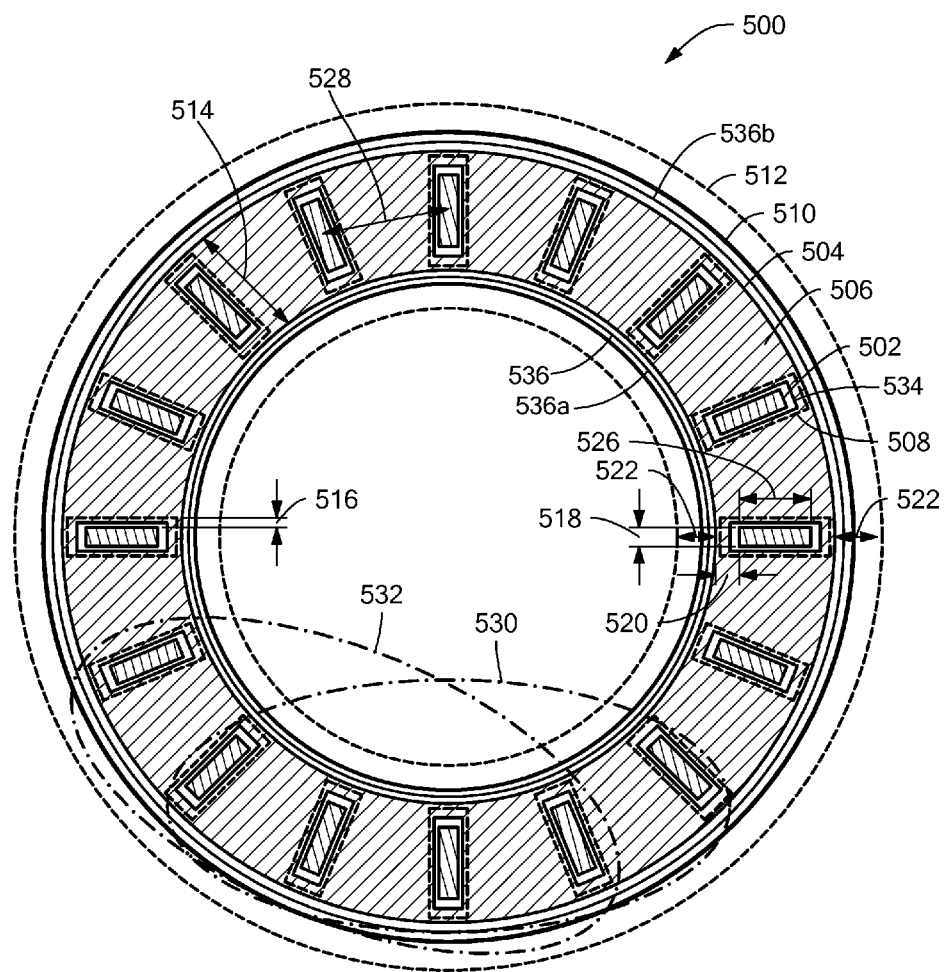
FIG. 5 is a block diagram showing a cross-sectional top view of a circular vertical Hall (CVH) sensing element having LN regions, having an LP region, and also having a pre-epi layer and/or having two epi layers.

Referring now to FIG. 5, a circular vertical Hall (CVH) sensing element 500 is essentially comprised of a plurality of vertical Hall Effect elements, all disposed over a common epitaxial region 504. The CVH sensing element 500 includes a plurality of pickups, of which a pickup 502 is representative.

While a vertical cross section of the vertical Hall Effect element is not shown, the cross section of the vertical Hall Effect element 500 is substantially the same as the cross section of FIG. 3 (i.e., with a pre-epi implant), and thus, is not shown here The CVH sensing element 500 is shown to include sixteen pickups. However, in other embodiments a CVH sensing element can have more than 16 pickups.

An individual vertical Hall Effect element 530 of the CVH sensing element 500 can include, for example, a first five adjacent pickups. A next vertical Hall Effect element 532 of the CVH sensing element 500 can include a second five adjacent pickups. In some embodiments, the first five adjacent pickups overlaps with the second five adjacent pickups, for example, with an overlap of one pickup, resulting in a total of sixteen overlapping vertical Hall Effect elements within the CVH sensing element 500. However, in other embodiments, the vertical Hall Effect elements need not overlap, or they can overlap by more than one vertical Hall Effect element contact, both resulting in a different number of vertical Hall Effect elements within the CVH sensing element 500.

In some embodiments each vertical Hall Effect element is driven in a chopped arrangement as described above in conjunction with FIGS. 2 and 3, in order to remove a DC offset voltage from each one of the vertical Hall Effect elements.

The CVH sensing element 500 is constructed over a substrate (not identified), in particular, within and upon the common epi region 504. An outer boundary of the epi region 504 is determined by an inner edge (closest to the pickups) of a P-well region that surrounds the pickups. The P-well region is implanted and diffused into the epi region 504.

A PBL structure 510 is disposed under the epitaxial layer 504 and over the substrate and also surrounds the plurality of pickups, e.g., 502. A dashed line 512 is representative of an edge the PBL structure 510 after it is implanted into the substrate but before it is diffused into the epi region 504 by heating steps in fabrication of the CVH sensing element 500.

The PBL structure 510 diffused upward and into the epi region 504 joins with or merges with the P-well region diffused downward into the epi region 504, forming a barrier to electrical charges that move within the epi region 504.

Adjacent pairs of the plurality of pickups are separated by so-called separation regions. Each one of the plurality of pickups, e.g., pickup 502, is comprised of an N+ diffusion.

In the separation regions is diffused portions of a low voltage P-well (LP) region, of which an LP region 506 is representative. A dashed line 508 is representative of an edge of the LP region 506 before it is diffused into the epi layer further by high temperatures used during manufacture of the CVH sensing element.

The CVH sensing element 500 can include LN regions, e.g. LN region 534, like the LN regions 202 of FIGS. 2, 3, 3A, and 3B. The LN regions are disposed under respective ones of the N+ pickups, e.g. 502.

The CVH sensing element 500 can also include a pre-epi layer 536 with boundaries 536a, 536b, which can be like the pre-epi layer 205 of FIGS. 2 and 3. However, in other embodiments, a CVH sensing element can include two epi layers, like the two epi layers 204, 204' if FIG. 3, with or without the pre-epi layer 536.

As described above in conjunction with FIG. 3, other layers (not shown) can be disposed over the epi region 504. In some embodiments the other layers 318 include other metal layers, other field oxide dielectric layer, and a passivation layer.

As described above, a vertical cross section of each vertical Hall Effect element of the CVH sensing element 500 can be the same as or similar to the cross section of the vertical Hall Effect element 200 shown in with FIG. 3. Operation of each one of the vertical Hall Effect elements of the CVH sensing element 500 is the same as or similar to operation described above in conjunction with FIGS. 2 and 3.

In some embodiments, a distance (Sp_pkpk) 528 between centers of adjacent pickups is within about +/− ten percent of 3.5 micrometers.

In some embodiments, a distance 520 (Es_pkep) between an edge of an outer one of the plurality of pickups and a closest edge of the P-well region (that defines the edge of the epi region 504) is within about +/− ten percent of 5.5 micrometers.

In some embodiments, a distance 516 (Sp_pklp) between an edge of each one of the pickups and a closest edge of the LP region 506 before it is diffused into the epi region is within about +/− ten percent of 0.4 micrometers. It will be understood that the LP regions, e.g., 506, after diffusion should not touch the pickups, e.g., the pickup 502.

In some embodiments, a height 526 (PKH) of each pickup is within about +/− ten percent of 9.0 micrometers.

In some embodiments, a width 518 (PKW) of each pickup is within about +/− ten percent of 1.0 micrometers.

In some embodiments, a smallest distance 522 (SP_eppb) between an outer edge of the epi layer 504 and a closest edge of the P-type buried layer (PBL) region 510 in a direction parallel to the major surface of the substrate before it is diffused, see, e.g. 512, is within about +/− ten percent of 5.0 micrometers.

In some embodiments, a width 514 (EP_width) of the epi region 504, i.e., a distance between opposite edges of the P-well region is within about +/− ten percent of 20.0 micrometers.

The above combination of doping concentration and dimensions can result in each vertical Hall Effect element within the CVH sensing element 500 having a sensitivity of about five to six microvolts per Gauss per volt.

Operation of a CVH sensing element similar to the CVH sensing element 500 is to described more fully, for example, in U.S. patent application Ser. No. 13/226,694, entitled "Magnetic Field Sensing Effect Combining A Circular Vertical Hall Magnetic Field Sensing Element With A Planar Hall Element," filed Sep. 7, 2011, which is assigned to the assignee of the present invention and which is incorporated herein in its entirety. Still further operation of a CVH sensing element is described in PCT Patent Application No. PCT/EP2008/056517, entitled "Magnetic Field Sensor for Measuring Direction of a Magnetic Field in a Plane," filed May 28, 2008, and published in the English language as PCT Publication No. WO 2008/145662, which application and publication thereof are incorporated by reference herein in their entirety.

All references cited herein are hereby incorporated herein by reference in their entirety.

Having described preferred embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims.

What is claimed is:

1. A Hall Effect element disposed over a substrate, the Hall Effect element comprising:
   an N-type epitaxial layer disposed over the substrate;
   a plurality of pickups implanted and diffused into the epitaxial layer, adjacent pairs of the plurality of pickups separated by separation regions, each one of the plurality of pickups comprising a respective N-plus type diffusion;
   a plurality of Light-N regions implanted and diffused into the epitaxial layer, each one of the plurality of Light-N regions disposed and a respective one of the plurality of pickups, wherein the Hall Effect element is configured to generate a Hall voltage between at least one pair of the plurality of pickups, wherein the Hall voltage is most responsive to a magnetic field directed parallel to a major surface of the substrate;
   a Light-P region implanted and diffused into the epitaxial layer, wherein the Light-P region extends into the separation regions;
   a P-type buried layer region disposed under the epitaxial layer, implanted and diffused into the substrate, and surrounding the plurality of pickups, wherein the P-type buried layer region is diffused from the substrate into the epitaxial layer; and
   a P-well region implanted and diffused into the epitaxial layer and surrounding the plurality of pickups at an upper surface of the epitaxial layer, wherein the P-type buried layer region and the P-well region are coupled in a direction vertical to the substrate so as to for a barrier to electrical charges within the epitaxial layer,
   wherein the Hall Effect element is configured to pass a drive current between at least two of the plurality of pickups, and wherein a depth of the Light-P region extending into the separation regions is selected to force the drive current deeper and more vertically into the epitaxial layer in relation to the major surface of the substrate, resulting in a more sensitive Hall Effect element.

2. The Hall Effect element of claim 1, further comprising:
   N-type pre-epitaxial implant layer implanted and diffused into the substrate and disposed under the epitaxial layer.

3. The Hall Effect element of claim 1, wherein the plurality of pickups is arranged in a straight line, forming a vertical Hall Effect element, or in a circle, forming a circular vertical Hall (CVH) sensing element.

4. A Hall Effect element disposed over a substrate, the Hall Effect element comprising:
   an N-type epitaxial layer disposed over the substrate;
   a plurality of pickups implanted and diffused into the epitaxial layer, adjacent pairs of the plurality of pickups separated by separation regions, each one of the plurality of pickups comprising a respective N-plus type diffusion;
   an N-type pre-epitaxial implant layer implanted and diffused into the substrate and disposed under the epitaxial layer, wherein the Hall Effect element is configured to generate a Hall voltage between at least one pair of the plurality of pickups, wherein the Hall voltage is most responsive to a magnetic field directed parallel to a major surface of the substrate;
   a P-type buried layer region disposed under the epitaxial layer, implanted and diffused into the substrate, and surrounding the plurality of pickups, wherein the P-type buried layer region is diffused from the substrate into the epitaxial layer; and
   a P-well region implanted and diffused into the epitaxial layer and surrounding the plurality of pickups at an upper surface of the epitaxial layer, wherein the P-type buried layer region and the P-well region are coupled in a direction vertical to the substrate so as to form a barrier to electrical charges within the epitaxial layer; and
   a Light-P region implanted and diffused into the epitaxial layer, wherein the Light-P region extends into the separation regions,
   wherein the Hall Effect element is configured to pass a drive current between at least two of the plurality of pickups, and wherein a depth of the Light-P region extending into the separation regions is selected to force the drive current deeper and more vertically into the epitaxial layer in relation s to the major surface of the substrate, resulting in a more sensitive Hall Effect element.

5. The Hall Effect element of claim 4, further comprising:
   a plurality of Light-N regions implanted and diffused into the epitaxial layer, each one of the plurality of Light-N regions disposed under a respective one of the plurality of pickups.

6. The Hall Effect element of claim 4, wherein the plurality of pickups is arranged in a straight line, forming a vertical Hall Effect element, or in a circle, forming a circular vertical Hall (CVH) sensing element.

7. A Hall Effect element disposed over a substrate, the Hall Effect element comprising:
  a first N-type epitaxial layer disposed over the substrate;
  a second N-type epitaxial layer disposed over the first epitaxial layer;
  a plurality of pickups implanted and diffused into the second epitaxial layer, adjacent pairs of the plurality of pickups separated by separation regions, each one of the plurality of pickups comprising a respective N-plus type diffusion;
  a P-type buried layer region disposed under the first epitaxial layer, implanted and diffused into the substrate, and surrounding the plurality of pickups, wherein the P-type buried layer region is diffused from the substrate into the first epitaxial layer;
  a P-well region implanted and diffused into the second epitaxial layer and surrounding the plurality of pickups at an upper surface of the second epitaxial layer, wherein the P-type buried layer region and the P-well region are coupled in a direction vertical to the substrate so as to form a barrier to electrical charges within the first and second epitaxial layers; and
  a Light-P region implanted and diffused into the second epitaxial layer, wherein the Light-P region extends into the separation regions,
  wherein the Hall Effect element is configured to pass a drive current between at least two of the plurality of pickups, and wherein a depth of the Light-P region extending into the separation regions is selected to force the drive current deeper and more vertically into the epitaxial layer in relation to the major surface of the substrate, resulting in a more sensitive Hall Effect element.

8. The Hall Effect element of claim 7, further comprising:
  a plurality of Light-N regions implanted and diffused into the second epitaxial layer, each one of the plurality of Light-N regions disposed under a respective one of the plurality of pickups.

9. The Hall Effect element of claim 7, further comprising:
  an N-type pre-epitaxial implant layer implanted and diffused into the substrate and disposed under the first epitaxial layer, wherein the Effect element is configured to generate a Hall voltage between at least one pair of the plurality of pickups, wherein the Hall voltage is most responsive to a magnetic field directed parallel to a major surface of the substrate.

10. The Hall Effect element of claim 7, wherein the plurality of pickups is arranged in a straight line, forming a vertical Hall Effect element, or in a circle, forming a circular vertical Hall (CVH) sensing element.

\* \* \* \* \*

UNITED STATES PATENT AND TRADEMARK OFFICE
CERTIFICATE OF CORRECTION

PATENT NO. : 9,099,638 B2
APPLICATION NO. : 13/836869
DATED : August 4, 2015
INVENTOR(S) : Yigong Wang et al.

It is certified that error appears in the above-identified patent and that said Letters Patent is hereby corrected as shown below:

In the specification,

Column 3, Line 29, delete "Fall Effect" and replace with --Hall Effect--.

Column 5, Lines 2-3, delete "FIGS. 2, 3, 3A, 4, 4A, and 4B." and replace with --FIGS. 2, 3, 3A, 3B, 4, 4A, and 4B.--.

Column 9, Line 59, delete "layer 304and" and replace with --layer 304 and--.

In the claims,

Column 14, Line 56, delete "in relation s to" and replace with --in relation to--.

Column 15, Lines 12-13, delete "substrate , and" and replace with --substrate, and--.

Signed and Sealed this
First Day of March, 2016

Michelle K. Lee
*Director of the United States Patent and Trademark Office*